United States Patent [19]
Campbell

[11] Patent Number: 6,150,602
[45] Date of Patent: Nov. 21, 2000

[54] LARGE AREA SOLAR CELL EXTENDED LIFE INTERCONNECT

[75] Inventor: Gregory A. Campbell, Sylmar, Calif.

[73] Assignee: Hughes Electronics Corporation

[21] Appl. No.: 09/318,650

[22] Filed: May 25, 1999

[51] Int. Cl.$^7$ .......................... H01L 31/05; H01L 31/042
[52] U.S. Cl. .......................... 136/244; 136/256; 136/292
[58] Field of Search .................. 136/244, 249, 136/256, 293, 292

[56] References Cited

U.S. PATENT DOCUMENTS

| | | | |
|---|---|---|---|
| 3,340,096 | 9/1967 | Mann et al. | 136/89 |
| 3,819,417 | 6/1974 | Haynos . | |
| 4,193,820 | 3/1980 | Thomas | 136/89 |
| 4,301,322 | 11/1981 | Amick | 136/256 |
| 4,577,051 | 3/1986 | Hartman | 136/244 |
| 4,697,042 | 9/1987 | Schilling | 136/244 |
| 5,006,179 | 4/1991 | Gaddy | 136/244 |
| 5,158,618 | 10/1992 | Rubin et al. | 136/244 |
| 5,919,316 | 7/1999 | Bogorad et al. | 136/256 |

*Primary Examiner*—Ellis Robinson
*Assistant Examiner*—Michael C. Miggins
*Attorney, Agent, or Firm*—V. D. Duraiswamy; M. W. Sales

[57] ABSTRACT

An improved solar cell interconnect comprises a first connecting portion for connection to a first solar cell and a second connecting portion for connection to a second solar cell immediately adjacent the first solar cell. A stress portion is disposed between the first and second connecting portions such that the stress portion can be positioned between the first and second solar cells. The stress portion has a plurality of alternating loop portions that form an undulating pattern.

17 Claims, 2 Drawing Sheets

LARGE AREA SOLAR CELL EXTENDED LIFE INTERCONNECT

BACKGROUND OF THE INVENTION

1. Field of the Invention

The present invention generally relates to photovoltaic cell interconnects and, more particularly, to an improved photovoltaic cell interconnect that provides increased stress relief without an increase in solar panel shading.

2. Description of Related Art

The interest in photovoltaic (PV) cells, including large area cells that are greater than about 2 cm by 2 cm, continues as concerns over pollution and limited resources continue. The continued interest has been in both terrestrial and non-terrestrial applications. In the non-terrestrial environment of outer space, the concern over limited resources of any type is a major one. This is because the need to increase the amount of a resource increases the payload, and an increased payload can increase the cost of a launch more than linearly. However, with the ready availability of solar energy in outer space for a spacecraft such as a satellite, the conversion of solar energy into electrical energy is an obvious alternative to increased payload.

Irrespective of the application, and as with any energy generation system, efforts have been ongoing into increasing the output and/or efficiency of PV cells. In terms of output, multiple cells or layers having different energy bandgaps have been stacked so that each cell or layer can absorb a different part of the wide energy distribution in the sunlight. A number of the stacked arrangements or cells have been provided in the form of an array on a substrate.

The efficiency of the array of solar cells is limited by the requirement of the cells being electrically connected to one another in series, in parallel or both. This has been accomplished by the use of interconnects between immediately adjacent cells. However, the individual solar cells and their substrate can be subject to significant mechanical vibration and/or thermal cycling, particularly in outerspace. The thermal cycling, however, leads to thermal expansion and contraction of the distance separating the cells, thereby causing stress on the interconnects. With greater stress in terms of frequency and magnitude, there can be a shorter life expectancy of the interconnect. With a shorter life expectancy of the interconnect, a solar panel in which the interconnect is utilized will have a shorter life expectancy. Ultimately, the spacecraft on which the solar panel is used will have a shorter life and result in greater costs.

Various past designs have attempted to alleviate the stress factor of the interconnect. For example, U.S. Pat. No. 5,006,179 discloses a solar cell interconnect that includes a planar, central portion that is positioned parallel to the edges of opposing solar cells. Two connecting parts are fixed at opposite ends of the central portion. One connecting part has an L-shaped configuration that is soldered to an edge of one solar cell. The opposite connecting part is also L-shaped but has a closed loop portion that is soldered to a planar surface of the adjacent solar cell. A disadvantage, however, to such design is the complexity in manufacturing.

Also shown in U.S. Pat. No. 5,006,179 is a prior art interconnect having a single open loop disposed between two planar ends. This design, however, was considered as being subject to fracturing of the interconnect and cell itself under repeated stress. There was also some suggestion that the prior art design prevented the cells in an array from being close to one another, thus increasing the space requirements.

U.S. Pat. No. 4,193,820 shows a solar cell interconnect having an overall Z-shape. Two flat strips are disposed at opposite ends. A hinge element is between the opposite ends. The hinge element is generally U-shaped and extends longitudinally between the edges of adjacent cells. A disadvantage to this design is that the flat strips are apparently covered by an adhesive that bonds together the cell and the substrate, thus causing the flexing members to seize and fail when the adhesive, in which the members are imbedded, is subjected to the low temperatures associated with satellite orbits.

Also shown in U.S. Pat. No. 4,193,820 is a prior art interconnect which is of a Z-shape. However, the central or middle portion does not have a U-shaped configuration. This prior art design was regarded as being unable to withstand severe strains in a transverse direction to the edges of adjacent cells.

U.S. Pat. No. 3,819,417 discloses mechanical, non-conducting solar cell interconnect strips. The non-conducting strips are interwoven. Thereby, if one strip goes over one cell and under the next, the other strip goes under the first cell and over the next. The portion of the strips that are positioned intermediate the edges of adjacent cells have a single open loop configuration. Electrical connection between cells is provided by regions of metallic patterns placed on the non-conducting strips. A disadvantage, however, to such mechanical and electrical interconnect is that two types of connections are required from two different materials, which tends to complicate manufacturing. Another disadvantage is that the interconnects take up active areas of the tops of the cells.

Further shown in U.S. Pat. No. 3,819,417 is a prior art interconnect that is generally Z- or S-shaped. Such prior art design was considered to provide insufficient flexibility. This was thought to lead to failure at the solar cell-interconnect interface.

As can be seen, there is a need for an improved solar cell interconnect that has a longer life and can withstand greater thermal expansions and/or mechanical vibrations. An improved solar cell interconnect is needed which is low cost, simple to manufacture, and easy to utilize. Also needed is an interconnect that is adaptable to different manners of connection. A further need is for a solar cell interconnect which minimizes the amount of shading of the cell.

SUMMARY OF THE INVENTION

The present invention is directed to an improved solar cell interconnect that has a longer life and can withstand greater thermal expansions and/or mechanical vibrations. The present invention provides an interconnect that can provide connection from a p-n cell to another p-n cell, as well as from a p-n cell to an n-p cell and vice versa. The improved solar cell interconnect of the present invention is low cost, simple to manufacture, and easy to utilize.

Specifically, the improved solar cell interconnect comprises a first connecting portion for connection to a first solar cell; a second connecting portion for connection to a second solar cell immediately adjacent the first solar cell; and a stress portion disposed between the first and second connecting portions such that the stress portion can be positioned between the first and second solar cells, with the stress portion having a plurality of alternating loop portions.

In another embodiment of present invention, the improved solar cell interconnect includes a first connecting portion for connection to a first solar cell; a second connecting portion for connection to a second solar cell immediately adjacent the first solar cell; and a stress portion disposed between the first and second connecting portions such that the stress portion can be positioned between the first and second solar cells, with the stress portion having an odd number of alternating loop portions, and the odd number being at least three.

In yet another embodiment of present invention, the improved interconnect comprises a first connecting portion for connection to a first solar cell; a second connecting portion for connection to a second solar cell immediately adjacent the first solar cell; and a stress portion disposed between the first and second connecting portions such that the stress portion can be positioned between the first and second solar cells, with the stress portion being characterized by a movement per loop which is approximately equal to $\delta x/n$ and further characterized by a fatigue stress factor that is proportional to $\delta x/ny$ wherein "$\delta x$" equals a distance of expansion between the first and second cells, "n" equals the number of loops in the stress portion, and "y" equals a height of the stress portion.

These and other features, aspects and advantages of the present invention will become better understood with reference to the following drawings, description, and claims.

DESCRIPTION OF THE PREFERRED EMBODIMENTS

The improved solar cell interconnect of the present invention is described below in various embodiments. In general, however, the interconnect of the present invention includes a first connecting portion and a second connecting portion disposed at the two distal ends of the interconnect. Therebetween, a stress portion includes a plurality of loop portions that alternate in an opposed fashion such that they form an undulating configuration.

Figure 4:
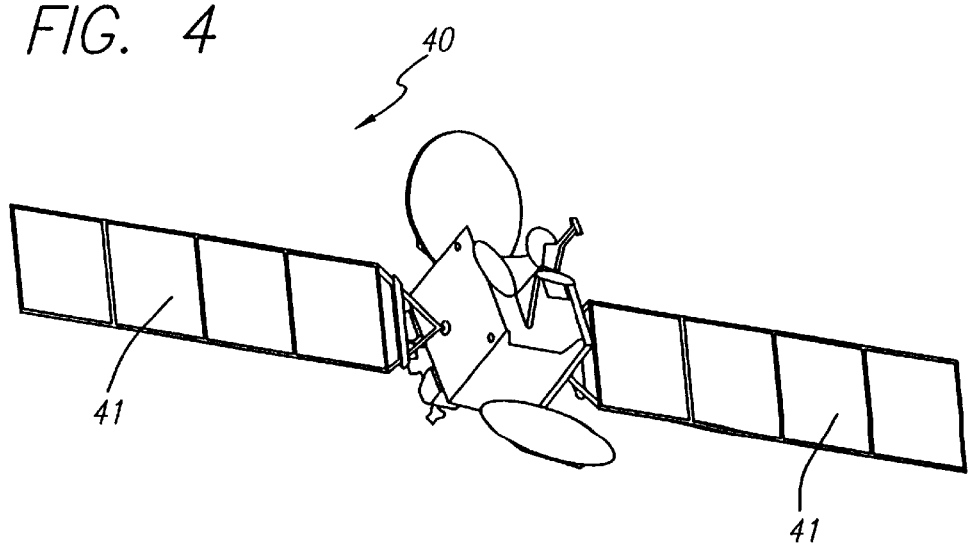
FIG. 4 is a perspective view of a satellite having a solar panel on which the interconnect of the present invention may be used.

Furthermore, while the present invention may be particularly useful in the context of spacecraft, such as in a solar panel 41 of a satellite 40 (FIG. 4), other applications—both terrestrial and non-terrestrial—are contemplated. Still further, even though the present invention is described in the context of a photovoltaic cell, the invention is not so limited. Other contexts, such as extreme environment semiconductor electrical connections, are contemplated to be within the scope of the present invention.

Figure 1:
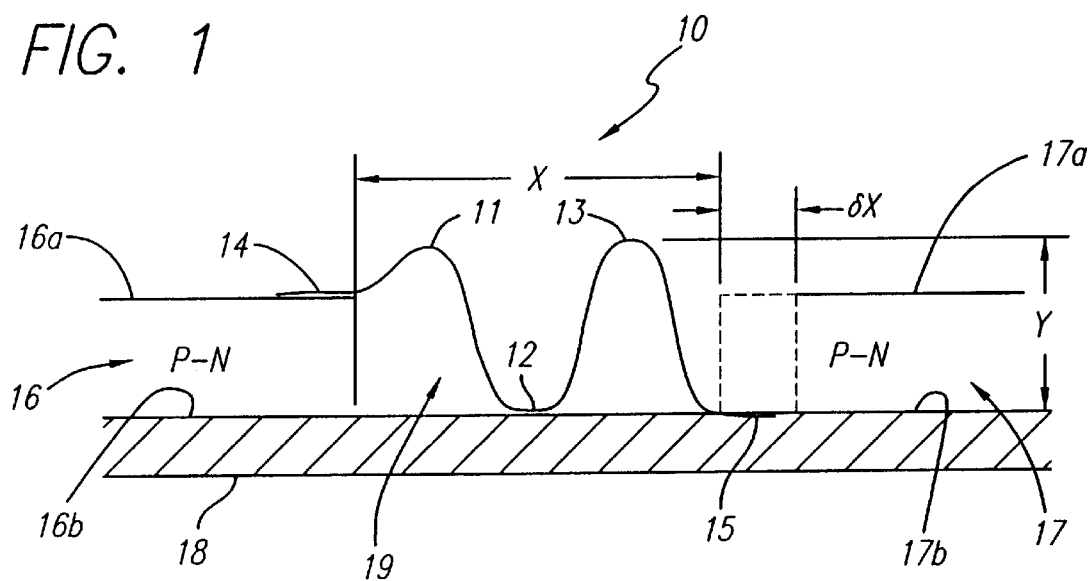
FIG. 1 is a side, schematic diagram of one embodiment of the interconnect according to present invention.

FIG. 1 depicts one embodiment of an interconnect 10 according to the present invention. The interconnect 10 can be made of an electrically conductive material, such as molybdenum. The interconnect 10 includes a first connecting portion 14 and a second connecting portion 15 which are located at the distal ends of the interconnect 10. The first connecting portion is generally planar in configuration so that it can be affixed to a first solar cell 16, such as by soldering. For purposes of illustration, the first solar cell 16 is shown in FIG. 1 as a p-n junction type cell that can be of any well known construction in the art. Similarly, the second connecting portion 15 is generally planar in configuration so that it can be affixed to a second solar cell 17, which is also shown in FIG. 1 as a p-n junction type cell.

When viewed from FIG. 1, the first solar cell 16 has a top surface 16a and a bottom surface 16b. Likewise, the second solar cell 17 has a top surface 17a and a bottom surface 17b. With both solar cells 16, 17 being of the same p-n type, the first connecting portion 14 is affixed to the top surface 16a of the first cell 16. The second connecting portion 15 is affixed to the bottom surface 17b of the second cell 17. This type of top-to-bottom connection provides a series connection between the cells 16, 17 that may be immediately adjacent to one another in the solar panel 41 of the satellite 40. Of course, it should be understood that the interconnect 10 can also provide a bottom-to-top connection. With such a top-to-bottom connection (and vice versa), a series electrical connection between the cells 16, 17 can be established.

The interconnect 10 further includes a stress portion 19 described by a height "y" and a length sufficient to span at least a distance "x" in FIG. 1. The stress portion 19 serves to absorb changes in a distance "$\delta x$" that represents vibrational and/or thermal expansion of the cell and substrate assembly described below. The stress portion 19 includes a plurality of planar loop portions 11,12,13. Although the number of loop portions in this embodiment is an odd number—specifically three—the present invention is not so limited. Regardless of the number of loop portions, the loop portions 11, 12, 13 can be seen in FIG. 1 as being disposed in an opposed and alternating fashion such that, in combination, the loop portions form an undulating pattern or configuration. It can be seen in FIG. 1 that each of the loop portions 11,12,13 is somewhat hemispheric in configuration. However, the particular radius over a given arc in each loop portion 11,12,13 may vary within each loop portion, as well as from one loop portion to another.

As seen in FIG. 1, the stress portion 19 is disposed between the first and second solar cells 16, 17, while such cells 16, 17 are fixed to a substrate 18 that can of any well know design in the art. Being so fixed to the substrate 18, the cells 16, 17 are fixed at a distance "x" from one another. Typically, the distance "x" between solar cells 16, 17 can range from about 0.30 to 0.60 inches. However, in outer-space as well as other environments, the cells 16, 17 and the substrate 18 are subject to vibrational and/or thermal expansion. When subjected to such expansion, the cells 16, 17 can become closer together, as represented by a distance of expansion "$\delta x$" in FIG. 1. Oftentimes, the distance of expansion "$\delta x$" can range from about 5 to 10 mils.

But as the cells 16, 17 move across the distance "$\delta x$," the stress portion 19 is able to absorb the expansion. Such absorption can be characterized by a movement per loop that is approximately equal to $\delta x/n$, wherein "$\delta x$" is the expansion distance and "n" is the number of loops. The stress portion 19 can be further characterized by a fatigue stress factor that is proportional to $\delta x/ny$, wherein "$\delta x$" is the expansion distance, "n" is the number of loops and "y" is the height of the stress portion 19.

With the movement per loop and the fatigue stress factor characteristics for the interconnect 10, it can be appreciated that the present invention provides advantages over the single loop design used in the past. For a given "$\delta x$," it can be seen that a single loop design must be able to absorb the expansion by itself. But with a plurality of loop portions, as in the present invention, the same amount of expansion is absorbed but in incremental amounts by each loop portion.

Consequently, each loop portion is subjected to less stress in the present invention, as compared to the single loop design in the past.

Figure 2:
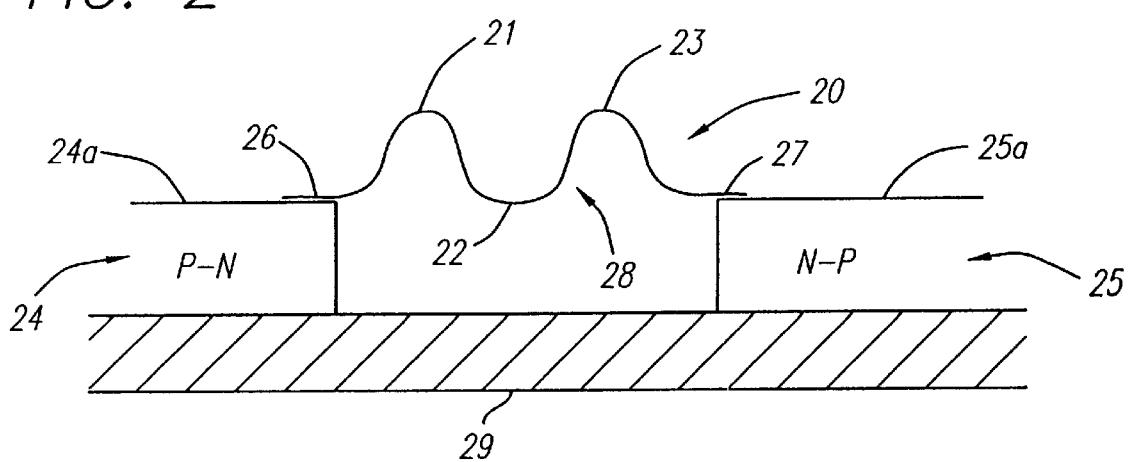
FIG. 2 is a side schematic diagram of another embodiment of the interconnect according to the present invention.

FIG. 2 represents another embodiment of the present invention. Therein, a top-to-top connection is shown, as opposed to the top-to-bottom connection in FIG. 1. Such a top-to-top connection may be useful in connecting a p-n type cell 24 to an n-p type cell 25. An interconnect 20 in this embodiment is essentially the same as that shown in FIG. 1. The interconnect 20 includes a stress portion 28 that has three loop portions 21,22,23. A first connecting portion 26 of the interconnect 20 is affixed to a top surface 24a of the first solar cell 24. A second connecting portion 27 is affixed to a top surface 25a of the second solar cell 25. Both cells 24, 25 are supported on a substrate 29.

Figure 3:
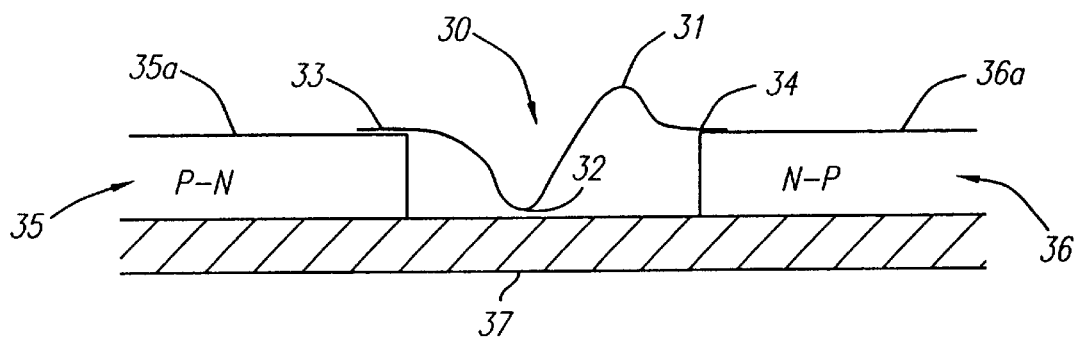
FIG. 3 is a side schematic diagram of yet another embodiment of the interconnect according to the present invention.

In FIG. 3, another embodiment of the present invention is shown. However, in contrast to the above embodiments, an interconnect 30 is characterized by an even number of loop portions 31, 32. While this embodiment only utilizes two loop portions 31, 32, other even numbers of loop portions is contemplated. Using an even number of loop portions is practical in this embodiment because the connection is not top-to-bottom or vice versa. Although the connection in FIG. 3 is shown as top-to-top, the connection can also be bottom-to-bottom. In either event, the interconnect 30 has a first connecting portion 33 that can be affixed to a top surface 35a of a p-n type cell 35. A second connecting portion 34 is affixed to a top surface 36a of an n-p type solar cell 36. A substrate 37 supports both cells 35, 36.

In all of the embodiments shown in FIGS. 1–3, the height "y" of the stress portion is shown as being greater than the height of the two solar cells. Ideally, the height "y" should not exceed the height of the solar cells, thereby eliminating any shadowing of the active surfaces of the cells that can be created by the interconnect. In practice, however, the provision of loop portions will necessitate the height "y" being greater than the height of the cells. Consequently, the difference in the height "y" and the height of the cells should be minimized to minimize shadowing.

Furthermore, while the embodiments shown in FIGS. 1–3 depict the interconnect as being "above" the substrate, the present invention is not so limited. Accordingly, the interconnect of the present invention may be disposed "below" the bottom surfaces of the cells, such as when the substrate has been punched with openings to allow the interconnects to extend therethrough.

As can be appreciated by those skilled in the art, the interconnect of the present invention is not limited to use of a single type junction cell in an array of cells. The interconnect also provides flexibility in use, since it can provide same side connections between adjacent cells, as well as opposite side connections between adjacent cells. The present invention further provides a longer life expectancy due to its characteristic movement per loop and fatigue stress factor.

It should be understood, of course, that the foregoing relates to preferred embodiments of the invention and that modifications may be made without departing from the spirit and scope of the invention as set forth in the following claims.

What is claimed is:

1. A solar cell interconnect, comprising:
   a first connecting portion having a planar surface configuration for fixed connection to a first solar cell such that expansion and contraction changes from said first solar cell are transferred to said interconnect;
   a second connecting portion having a planar surface configuration for fixed connection to a second solar cell immediately adjacent said first solar cell such that expansion and contraction changes from said second solar cell are transferred to said interconnect; and
   a stress portion having a planar surface configuration and disposed between said first and second connecting portions such that said stress portion can be positioned between said first and second solar cells, said stress portion having a plurality of planar loop portions said loop portions being in a plate substantially perpendicular to planes of a surface of said first solar cell and a surface of said second solar cell when connected.

2. The interconnect of claim 1, wherein said stress portion is characterized by "n" number of loop portions and "n" is an odd number.

3. The interconnect of claim 1, wherein said stress portion is characterized by "n" number of loop portions and "n" is an even number.

4. The interconnect of claim 1, wherein said interconnect is characterized by a movement per loop which is approximately equal to δx/n wherein "δx" equals a distance of expansion between said cells and "n" equals the number of loop portions.

5. The interconnect of claim 1, wherein said interconnect is characterized by a fatigue stress factor that is proportional to δx/ny wherein "δx" equals a distance of expansion between said cells, "n" equals the number of loop portions, and "y" equals a height of said stress portion.

6. The interconnect of claim 1, wherein said first and second cells are p-n junction cells.

7. The interconnect of claim 1, wherein said first and second cells are n-p junction cells.

8. The interconnect of claim 1, wherein said first cell is a p-n junction cell and said second cell is an n-p junction cell.

9. A solar cell interconnect, comprising:
   a first connecting portion for fixed connection to a first solar cell, said first connecting portion being formed separately on said first solar cell;
   a second connecting portion for fixed connection to a second solar cell immediately adjacent said first solar cell, said second connecting portion being formed separately on said second solar cell; and
   a stress portion having a plurality of planar loop portions disposed between said first and second connecting portions such that said stress portion can be positioned between said first and second solar cells, said stress portion being characterized by a movement per loop portion which is approximately equal to δx/n wherein "δx" equals a distance of thermal expansion between said first and second cells and "n" equals the number of loop portions, said loop portions being in a plane substantially perpendicular to planes of a surface of said first solar cell and a surface of said second solar cell when connected.

10. The interconnect of claim 9, wherein "n" is an odd number that is at least three.

11. The interconnect of claim 9, wherein "n" is an even number.

12. The interconnect of claim 9, wherein said interconnect is characterized by a fatigue stress factor that is proportional to δx/ny wherein "δx" equals a distance of thermal expansion between said first and second cells and "y" equals a height of said stress portion.

13. The interconnect of claim 9, wherein said first connecting portion connects to a top surface of said first cell and said second connecting portion connects to a bottom surface of said second cell.

14. The interconnect of claim 9, wherein said first connecting portion connects to a top surface of said first cell and said second connecting portion connects to a top surface of said second cell.

15. A solar cell interconnect for use in a spacecraft, comprising:
- a first connecting portion having a planar surface configuration for connection to a first surface of said first solar cell such that expansion and contraction changes from said first solar cell are transferred to said interconnect, said first connecting portion being on said first solar cell;
- a second connecting portion having a planar surface configuration for connection to a second surface of said second solar cell immediately adjacent said first solar cell such that expansion and contraction changes from said second solar cell are transferred to said interconnect, said second connecting portion being formed separately on said second solar cell; and
- a stress portion having a plurality of planar loop portions disposed between said first and second connecting portions such that said stress portion can be positioned between said first and second solar cells, said stress portion being characterized by a movement per loop which is approximately equal to $\delta x/n$ and further characterized by a fatigue stress factor that is proportional to $\delta x/ny$ wherein "$\delta x$" equals a distance of expansion between said cells, "n" is the number of loops in said stress portion and "y" equals a height of said stress portion, said loops being in a plane substantially perpendicular to planes described by said first and second surfaces.

16. The interconnect of claim 15, wherein "n" is an odd number.

17. The interconnect of claim 15, wherein "n" is an even number.

* * * * *